HOT GAS THERMO-COMPRESSION BONDING

Filed Oct. 28, 1963 2 Sheets-Sheet 1

CLAIR A. JOHNSON
INVENTOR.
BY D. Carl Richards

United States Patent Office 3,409,977

Patented Nov. 12, 1968

3,409,977

HOT GAS THERMO-COMPRESSION BONDING

Clair Allen Johnson, Dallas, Tex., assignor to Texas Instruments Incorporated, Dallas, Tex., a corporation of Delaware

Filed Oct. 28, 1963, Ser. No. 319,135
4 Claims. (Cl. 29—494)

This invention relates to the bonding of lead wires to semiconductor devices and to transistor terminal posts. In a more specific aspect, the invention relates to the control of lead bonding by the confined flow of hot gas to a limited area of contact between two elements.

In bonding fine lead wires to conductive stripes on semiconductor wafers and to terminal posts, the practices followed in the art have involved heating the entire transistor structure including header, water, and lead wires while bonding the lead wires to the desired conductive portions of the transistor while maintaining contact between the elements to be fused. By reason of characteristics inherent in the semiconductor device, it is necessary to limit the temperature to which the device may be elevated in order to avoid destroying junctions therein. It has further been found that prior art techniques are time-consuming and yield relatively low production.

It is an object of the present invention to overcome limitations of such prior art procedures and to increase the speed and reliability with which transistor leads may be installed. It has been discovered that a sharply limited flow of hot gas playing onto a localized area in which a lead is pressed onto a conductive area facilitates bonding thereof at rates which mark a substantial increase in production.

More particularly, in accordance with the present invention, there is provided a system for attaching lead wires in which a chisel tip is brought to bear with a predetermined loading factor onto the lead wire pressing it against the surface to which the lead wire is to be bonded. At the same time, gas of controlled composition is directed through an elongated capillary onto the contact zone. Means are provided for maintaining the walls of the flow channel at a predetermined temperature for heat transfer to heat the metals at the point of contact to a fusion temperature to form a bond.

In a more specific aspect, a lead wire placed over a metal contact is pressed onto the contact by a preloaded chisel. A heated hypodermic needle is directed towards the contact zone. Means are provided for flowing a gas of predetermined composition through the needle for transfer of heat from the walls of the needle to the contact zone for bonding of the lead.

For a more complete understanding of the present invention and for further objects and advantages thereof, reference may now be had to the following description taken in conjunction with the accompanying drawings in which.

Figures 1, 2, 3:
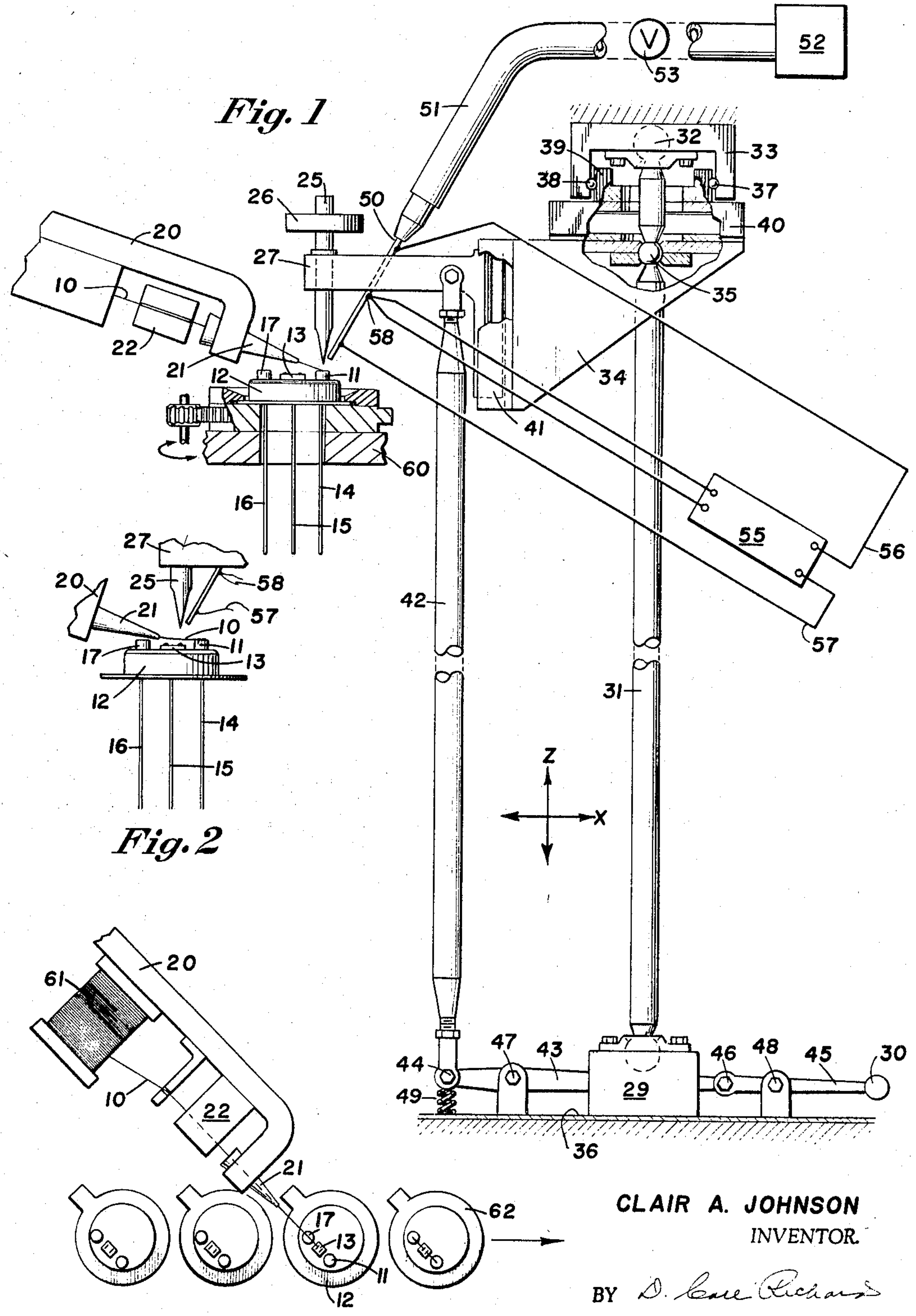
FIGURE 1 illustrates a system embodying the present invention with a lead wire being bonded to a transistor terminal post.
FIGURE 2 illustrates the system of FIGURE 1 but with the lead wire being bonded to a conductive stripe on a semiconductor wafer.
FIGURE 3 is a plan view of the unit of FIGURES 1 and 2.

FIGURE 1 illustrates a system for fastening a lead wire 10 issuing from a suitable supply spool onto a terminal post 11 of a header 12. The same lead wire later is to be bonded onto a conductive metal strip on the surface of a semiconductor wafer 13 mounted on a header 12.

The wafer 13 is mounted on the upper surface of the header 12 with three leads 14, 15, and 16 extending therefrom. Lead 14 is electrically connected to the terminal post 11. Lead 15 is connected to the header 12 and thus to one zone of the wafer 13. The lead 16 is connected to a terminal post 17.

A lead wire supply device 20 is provided with a capillary feed tube 21 and a clamp 22 for positioning and controlling the lead wire 10 such that the end thereof initially extends over and above the post 11. The lead supply system is movable in three coordinates above the wafer 13 as will hereinafter be explained.

A chisel 25 provided with a weight 26 at the upper end thereof is mounted for vertical slide movement in an arm 27. The arm 27 is mounted for movement in a vertical direction to raise and lower chisel 25 under the control of a set of levers leading to a handle 30. The knob 29 is connected at a ball joint to the lower end of a lever or joy stick 31. The upper end of lever 31 is secured in a ball and socket joint 32 in a fixed frame member 33. A floating frame member 34 is coupled at a ball and socket joint 35 to the lever 31 near the upper end thereof. Thus, the knob 29 resting on a smooth, flat surface 36 may be moved in X and Y coordinates with substantial displacements. However, the frame 34, by reason of the ball and socket coupling 35, will follow the movement of the knob with proportionally reduced displacements. The reduction depends upon the relative distances between ball and sockets 29 and 32 and ball and sockets 32 and 35.

Three slide elements are coupled to the floating frame 34. The first or Y-center slide element 39 is mounted on rollers 37 and 38 for support by the fixed frame 33. The frame 33 has a downwardly-opening channel with outer flanges or plates which form races for the rollers 37 and 38. Element 39 rolls along the Y-axis as viewed in FIGURE 1. A second bar, an X-center slide 40, is similarly roller-mounted so that the lever 31 will be free to move in the X and Y directions. A third slide element 41 is mounted with one portion thereof secured to the vertical side of the floating frame 34. A second portion of the slide 41 supports the arm 27. The portion to which the arm 27 is secured is coupled by way of a linkage including lever arms 42 and 43, which are linked at point 44, and lever arm 45, linked to arm 43 at point 46. The end of lever 45 opposite the point 46 is coupled to a handle 30. Adjacent to the point 44 is a fulcrum 47. Adjacent to point 46 is a second fulcrum 48. By depressing and raising the handle 30, the slide 41 will be actuated to lower and raise the chisel 25. A spring 49 normally maintains chisel 25 elevated.

It is to be understood that a mirror image of the system for manipulating arm 27 is provided for the filament supply structure 20. Thus, the filament 10 and the chisel 25 are freely movable, within limits, to hover over the top of the transistor header for locating the filament at the site to be welded and for locating the chisel 25 over the filament. Chisel 25 when lowered, presses the lead filament onto the bond site.

The arm 27 supports an elongated, hollow, hypodermic needle 50. Needle 50 is directed downward at an angle toward the point or tip of the chisel 25. The needle 50 is connected by way of tube 51 to a pressurized source 52 of a suitable gas. The flow of gas from source 52 is controlled and regulated by a regulator valve 53. Gas flows through the needle 25 onto the zone at which the lead 10 is maintained in contact with the top of post 11.

A current supply unit 55 is connected by way of conductor 56 to a terminal at the base of the needle 50. It is connected by way of conductor 57 to a terminal near the tip of the needle 50. Current thus is caused to flow through the needle 50 to heat the same to an elevated temperature, the magnitude of which is controlled in unit 55 by sensing the temperature of the needle with a thermocouple 58 and utilizing this condition to control the current source 55. Thus, with the needle 50 maintained at an elevated temperature, gas flowing through the needle will be heated prior to impinging the bonding zone.

In operation, the lead wire 10 projects from the end of the lead wire spout 21 to overlie the post 11. Knob 29 is then manipulated to position the chisel 25 directly above the lead wire. Handle 30 is then depressed to lower the arm 27. The weight of the chisel 25 then rests upon the lead wire 10. Flow of heated gas heats the limited area to bond the lead wire to the top of the post 11. The manipulator knob 29 and handle 30 are then actuated to elevate the chisel 25 from the lead wire 10. In practice, the chisel is then moved slightly in the X direction to bond a second point on post 11 and then at a third point. The manipulator unit 28 is actuated to move the chisel 25 directly above a conductive stripe on the upper face of the wafer 13 as shown in FIGURE 2. At this position, upon actuation of the knob 29 and handle 30, the chisel 25 is lowered onto the wire 10 to press the lead wire 10 onto the stripe on the upper face of the wafer 13. Flow of heated gas bonds the lead wire 10 to the conductive stripe. The feed actuator unit (not shown) is then moved with the lead wire 10 clamped to break off the lead wire adjacent to the bonded zone. With the bonding operation completed, the manipulator 28 is actuated to elevate the chisel 25 from the lead wire 10.

At this time, the support structure 60 for the header 12 is rotated for interchange of the positions of the posts 11 and 17. The foregoing operations are then repeated to attach a second lead wire to post 17 and then to a second conductor stripe on the wafer 13.

As illustrated in FIGURE 3, the header 12 is at the welding station and is positioned preparatory to bonding lead wires thereon from the spool 61. A header 62 is shown with leads attached thereto, having been indexed away from the welding station.

Figure 4:
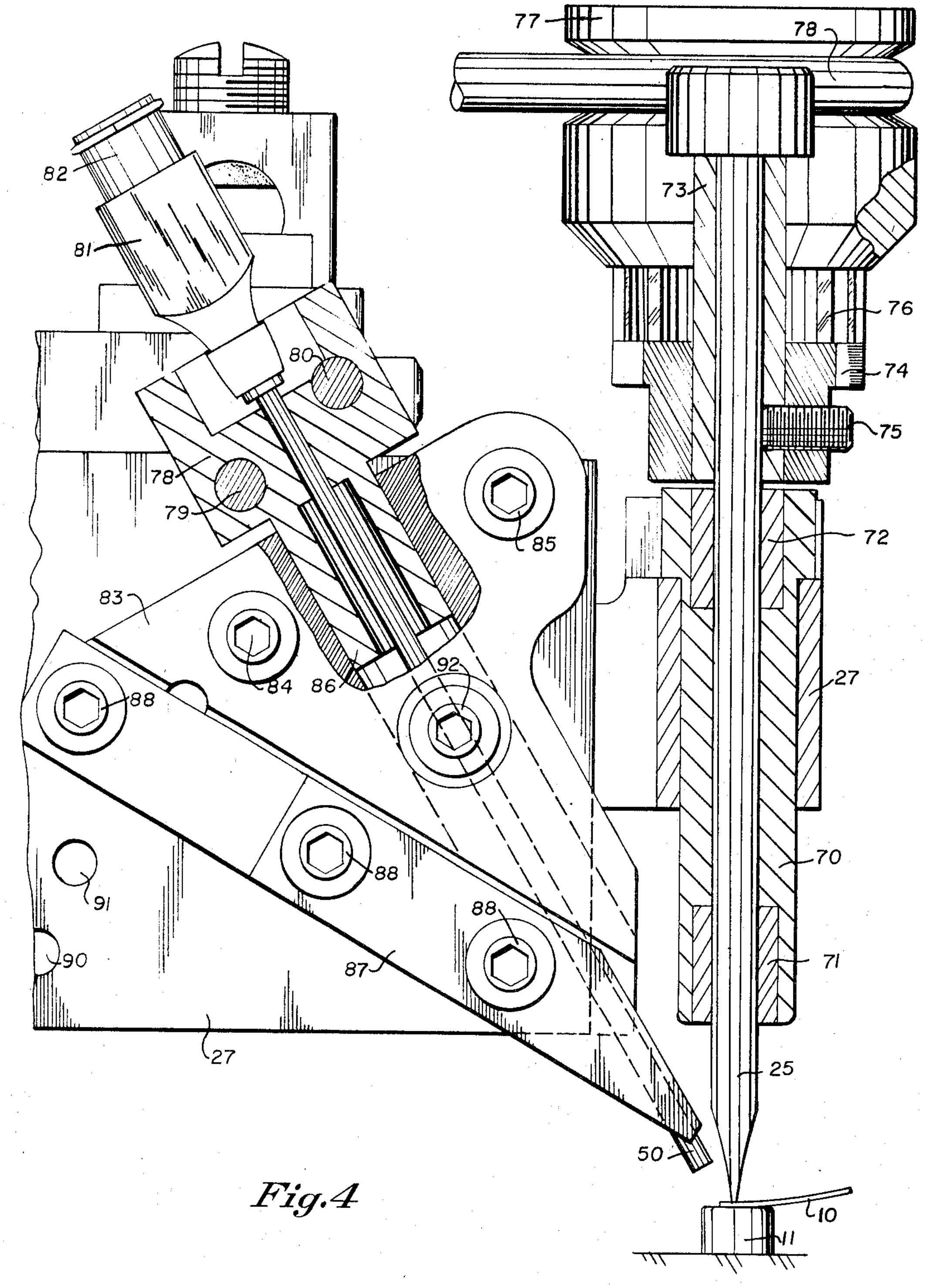
FIGURE 4 is an enlarged view of the bonding elements.

FIGURE 4 is an enlarged view partially in section showing one embodiment of the system. In this system, a chisel 25 is slidably mounted in a holder 70 having a lower bearing 71 and an upper bearing 72. The chisel extends upward above the upper end of bearing 72 and is provided with a cylindrical weight 73 and a sprocket gear 74. The gear 74 and the weight 73 are securely fixed to the chisel 25 by a set screw 75. The chisel 25 normally is supported by the gear 74 resting on the upper surface of bearing 72. The bearings 71 and 72 are mounted in the ends of the tube 70. Tube 70 is supported at the end of the arm 27.

The gear 74 meshes with an idler gear 76 which is mounted on a shaft (not shown) directly behind the chisel 25 and which is driven by a third gear forming a part of a pulley structure 77. A belt 78 engages the pulley structure 77 to impart rotational motion to the idler 76 and thence to the sprocket gear 77 to orient the blade of the chisel 25.

The lower end of the chisel 25 is sharpened to provide a limited contact area on the upper surface of the lead wide 10 as the latter is pressed down onto the upper surface of the post 11. The needle 50 is mounted in a holder which makes electrical contact at the upper end of the needle. More particularly, a clamp device 78 is clamped onto the needle 50 as by screws 79 and 80. The needle 50 is of the common hypodermic variety having a base fixture 81 and a nipple 82 onto which the tube 51 of FIGURE 1 is to be attached. The clamp 78 is mounted in a holder 83 which is secured to the arm 27 by screws 84 and 85. The holder 83 is of insulating material and has an aperture therein into which the lower end 85 of the clamp 78 fits. The holder 83 supports a pair of rigid, elongated electrodes, one of which, the electrode 87, is shown in FIGURE 4. The electrode 87 is fixed at the lower sloping edge of the holder 83 by bolts 88. The electrode 87 has an angular groove extending to the tip thereof in which the lower end of the needle is fitted. The bolts 88 clamp two electrodes, including electrode 87, onto the needle 50 to provide mechanical support and to maintain electrical contact therewith. The source 55, FIGURE 1, may then be connected to the clamp 78 and to the electrode 87 for flow of current along the length of the needle 50 to heat the same to a substantially elevated temperature.

Screws 84 and 85 are served into holes in the arm 27 which form portions of an array of holes including holes 90, 91, etc. By this means, the angle at which the needle 50 is directed onto the tip of the chisel, the wire 10, and the post 11, may be varied.

A thermocouple is mounted in the holder 83 at the site of the threaded insert 92 to maintain contact with the stem of a needle between the electrode 87 and the clamp 78. Electrical conductors, as illustrated in FIGURE 1, extend from such thermocouple for control of the magnitude of the current through the needle such that the temperature will be maintained substantially constant.

It will be noted that only does the flow of heated gas from the needle 50 play on the lead 10 and the post 11 but also heats the tip of the chisel 25 so that a suitable bond can be effected between the lead wire 10 and the post 11. In practice, the angle at which the heated gas impinges the work, the distance from the point of the needle 50 to the work, the dimensions of the chisel, the gas flow rate, and the needle temperature are variables which may be adjusted for optimum operating conditions. It has been found, however, that there are a number of different settings of the various parameters that will be found suitable as may be determined through trial and error. With such a system, it is possible to attach leads at a substantially increased production rate. In timing operations where operators of some aptitude have been seasoned to operation of this system, an interval of no more than about four seconds may be required between the instant that the lead wire 10 is indexed to a position over post 11 until the lead wire feed 20 is retracted and broken from the weld on the semiconductor strip. This involves lowering the chisel onto the wire 10 at three different locations on the post 11, indexing the chisel and the lead wire above a selected strip on the semiconductor wafer, lowering the chisel onto the wire at that location for one binding operation, and breaking the lead wire from the latter bond zone. The dwell time of the chisel on the wire at any one of the bonding points is minimal. The system may be actuated to move from one point to another as fast as an operator can lower and raise the chisel onto and away from the work. The rapidity with which the bond is effected is due to the concentration of the flow of heated gas onto the limited area at which the bonding is to take place. This means that the limited area may be raised to substantially higher temperatures than is possible through conventional methods where the entire mass is heated. The substantially higher temperatures may be tolerated in limited zones since the temperature gradients are very high and damaging temperatures will not be applied to such critical zones as junctions in the semiconductor device. By employing high temperature gas, much shorter intervals are permissible to heat the materials to a bonding temperature. Thus, there is provided a system for substantially increased ability to secure lead wires onto minute conductive areas.

In accordance with one embodiment of the invention, the needle 50 had an outside diameter of 0.064 inch and an inside diameter of 0.046 inch. Forming gas comprised of 90% nitrogen and 10% hydrogen was forced through the needle at a rate of about 700 cc. per minute. The needle was maintained at a temperature in the range of 350° C. to 500° C. and preferably at about 400° C. The chisel body made of high-speed tool steel had a diameter of 0.094 inch and a total weight on the tip of the order of about 15 grams. The chisel point was worked into the form of a rectangle 0.0035 inch long and 0.0008 inch wide. The lead wire had a diameter of 0.0007 inch and was of commercially pure gold. The two conductive stripes on the wafer 13 were of gold and aluminum alloyed into a germanium substrate.

In the foregoing, the operation has been described in connection with bonding lead wires from a single supply source to several different terminals. In some operations, where contact areas are of different metals, different temperature ranges and/or a lead wire of different metal may be employed than the temperatures above-noted and the gold lead wire above-described. Dual lead wire feed units may thus be employed wherein the lead wire supply unit is provided with two capillaries and two holders for supply spools. Further, dual chisel and heating units may be employed in which the temperature and the flow rates may differ so as to accommodate the bonding requirements of two different metal systems.

It has further been found that the most improved bond obtainable with the present system is achieved by reason of the fact that both a bond site and the lead wire are heated prior to any contact being made therebetween. That is, in each case the heated jet of gas plays on the bond site and upon the lead wire before the chisel forces the lead wire down onto the zone of contact. This being the case, the bond formed has dual characteristics, namely those of a compression bond and an alloy bond. The bodies having surfaces to be bonded are initially supported in a flow of heated gas and are subsequently forced into contact. The surfaces are maintained in the gas stream during the interval from prior to the time of contact until after the contact under the pressure of the chisel. The surfaces thus brought into contact are preheated and are thus amendable to bonding.

With the weight of a chisel supported by the lead wire, a highly confined, preferably continuous, flow of heated gas is directed onto the lead wire and the contact to heat the lead wire and the contact to a bonding temperature. The hypodermic needle of FIGURE 4 is heated by flow of current along a length of the needle. An induction heating arrangement, as well-known in the art, may be employed to heat needle 25. If desired, a photocell may be employed in place of the thermocouple to sense the temperature of the needle. In accordance with applicant's method, a force is applied to a heated transistor element such as a lead wire to bring it into contact with a conductive structure of a transistor at a bond site. The method may also be employed to bond a wafer 13 to header 12 in that both elements may be heated locally prior to contact by a confined flow of heated gas. The jet of heated gas is directed onto an area substantially limited to the site for localized heating of the lead wire and the structure to a bonding temperature. While a specific form of apparatus has been illustrated for use in connection with carrying out the foregoing method, some of the steps are carried out by hand under observation of an operation in a microscope field.

Having described the invention in connection with certain specific embodiments thereof, it is to be understood that further modifications may now suggest themselves to those skilled in the art and it is intended to cover such modifications as fall within the scope of the appended claims.

What is claimed is:

1. The method of bonding lead wires to a conductive structure on a semiconductor device which comprises:

(a) moving the free end of a lead wire to position the same over said conductive structure,
(b) maintaining a force sufficient to cause bonding on said lead wire to force said wire into contact with said structure, and
(c) directing a jet of heated gas onto said wire and said structure at the point of contact to heat them to a bonding temperature, whereby a bond is formed through the application of said heated gas and pressure from said force.

2. The method of bonding lead wires to a conductive structure on a semiconductor device which comprises:

(a) moving the free end of a lead wire to position the same over said conductive structure,
(b) maintaining a force sufficient to cause bonding on said lead wire at a zone limited in the axial direction of said wire to a length of the order of the diameter of said wire to force said wire into contact wtih said structure, and
(c) directing a confined jet of heated gas onto said wire and said structure at the point of contact to heat them to a bonding temperature, whereby a bond is formed through the application of said heated gas and pressure from said force.

3. The method of bonding two elements of a semiconductor device which comprises:

(a) supporting a first of said elements above the other,
(b) directing a jet of heated forming gas to dimensionally limited zones on both of said elements to heat them to bonding temperature, and
(c) while said elements are in said jet mechanically forcing the first element onto the other with a force sufficient to cause bonding, whereby a bond is formed through the application of said heated gas and pressure from said force.

4. The method of bonding two elements of a semiconductor device which comprises:

(a) supporting a first of said elements above the other,
(b) directing a jet of heated forming gas of cross section which is small compared with the area of said device onto both of said elements to heat them to bonding temperature, and
(c) while said elements are in said jet mechanically forcing the first element onto the other with a force sufficient to cause bonding by contact with said first element in an area which is very small compared to the dimensions of the cross section of the jet, whereby a bond is formed through the application of said heated gas and pressure from said force.

References Cited

UNITED STATES PATENTS

| | | | | |
|---|---|---|---|---|
| 3,071,852 | 1/1963 | Rogers | 29—494 | X |
| 3,091,849 | 6/1963 | Cohen | 29—494 | X |
| 3,136,032 | 6/1964 | Berndsen | 29—589 | X |
| 3,211,353 | 10/1965 | Belardi | 228—3 | |
| 3,224,072 | 12/1965 | Summers et al. | 29—498 | |
| 3,149,510 | 9/1964 | Kulicke | 228—44 | |
| 3,061,923 | 11/1962 | Knapp et al. | 29—498 | |
| 2,220,545 | 11/1940 | Reinhardt | 29—498 | |

JOHN F. CAMPBELL, *Primary Examiner.*

R. F. DROPKIN, *Assistant Examiner.*